United States Patent
Hsu

(10) Patent No.: US 9,059,722 B2
(45) Date of Patent: Jun. 16, 2015

(54) METHOD AND APPARATUS FOR ESTIMATING SAMPLING DELAY ERROR BETWEEN FIRST AND SECOND ANALOG-TO-DIGITAL CONVERTERS OF TIME-INTERLEAVED ANALOG-TO-DIGITAL CONVERTER

(71) Applicant: Realtek Semiconductor Corp., HsinChu (TW)

(72) Inventor: Hong-Ta Hsu, Hsinchu (TW)

(73) Assignee: Realtek Semiconductor Corp., Science Park, HsinChu (TW)

(*) Notice: Subject to any disclaimer, the term of this patent is extended or adjusted under 35 U.S.C. 154(b) by 0 days.

(21) Appl. No.: 14/307,475

(22) Filed: Jun. 17, 2014

(65) Prior Publication Data
US 2014/0368364 A1 Dec. 18, 2014

(30) Foreign Application Priority Data
Jun. 18, 2013 (TW) .............................. 102121619 A

(51) Int. Cl.
*H03M 1/06* (2006.01)
*H03M 1/08* (2006.01)
*H03M 1/12* (2006.01)

(52) U.S. Cl.
CPC .......... *H03M 1/0624* (2013.01); *H03M 1/0836* (2013.01); *H03M 1/1215* (2013.01)

(58) Field of Classification Search
CPC ... H03M 1/0624; H03M 1/0836; H03M 1/1215
USPC ......................................... 341/155, 118, 120
See application file for complete search history.

(56) References Cited

U.S. PATENT DOCUMENTS

| | | | | |
|---|---|---|---|---|
| 7,741,982 | B2 * | 6/2010 | Johansson et al. ............ | 341/118 |
| 8,698,659 | B2 * | 4/2014 | Hovakimyan et al. ........ | 341/118 |
| 8,730,072 | B2 * | 5/2014 | Petigny et al. ................ | 341/120 |
| 8,872,680 | B2 * | 10/2014 | Ali ................................ | 341/120 |

* cited by examiner

*Primary Examiner* — Brian Young
(74) *Attorney, Agent, or Firm* — Winston Hsu; Scott Margo

(57) ABSTRACT

A method for estimating a sampling delay error between a first analog-to-digital converter (ADC) and a second ADC in a time-interleaved ADC includes: receiving a first digital output signal and a second digital output signal generated from the first ADC and the second ADC based on a same analog input signal, respectively; determining a delay amount according to a predetermined sampling delay between the first ADC and the second ADC and a delay adjusting value, and applying the delay amount delay to the second digital output signal to generate a delayed digital output signal, wherein the delay adjusting value Td is used to estimate the sampling delay error Te; calculating a difference between the first digital output signal and the delayed digital output signal; and feeding back the difference for adjusting the delay adjusting value Td according to the difference.

14 Claims, 3 Drawing Sheets

METHOD AND APPARATUS FOR ESTIMATING SAMPLING DELAY ERROR BETWEEN FIRST AND SECOND ANALOG-TO-DIGITAL CONVERTERS OF TIME-INTERLEAVED ANALOG-TO-DIGITAL CONVERTER

BACKGROUND OF THE INVENTION

1. Field of the Invention

The present invention relates to a method and an apparatus for estimating a sampling delay error of a time-interleaved analog-to-digital converter (ADC) for calibrating sampling delay between sub-ADCs.

2. Description of the Prior Art

Current demand for an operating frequency of a state of the art ADC is over 1 GHz. Due to implementation challenges of the analog circuits, a time-interleaved ADC has been developed. In the time-interleaved ADC, the same input signal is sampled by multiple sub-ADCs, each operating at a lower frequency, to generate digital output results. The digital output results are then combined in a time-interleaved manner to produce a sampling result which is equivalent to an output that should be generated from an ADC with a high sampling frequency.

Taking a two-path sub-ADC (which includes a first ADC and a second ADC) for example, the first ADC outputs odd-numbered sampling values (i.e. sampling values indexed by 1, 3, 5 . . . ) and the second ADC outputs even-numbered sampling values (i.e. sampling values indexed by 2, 4, 6 . . . ). The odd-numbered sampling values and the even-numbered sampling values are then merged into consecutive numbered sampling values (i.e. sampling values indexed by 1, 2, 3, 4, 5, 6 . . . ). Although the sampling intervals (i.e. sampling periods) of the first and the second ADCs are both 2*Ts, the sampling interval of the merged output is not guaranteed to be Ts uniformly due to an inherent sampling delay error between the sub-ADCs. In an ideal Case, the sampled values indexed by 1, 3, 5 . . . are sampled at respective time Ts, 3*Ts, 5*Ts . . . . The sampled values indexed by 2, 4, 6 . . . are sampled at respective time 2*Ts, 4*Ts, 6*Ts . . . . The ideal sampling delay (i.e. the delay time between the sampling time of the first ADC and the sampling time of the second ADC) between the first and the second ADCs is Ts, but the existence of the sampling delay error makes the real digital output of the time-interleaved ADC inconsistent with the expected output. It is assumed that a sampling delay error Te is incorporated into the sampling time of the odd-numbered sampled values output by the first ADC. In this case, sampled values indexed by 1, 3, 5 . . . are sampled at respective time Ts+Te, 3*Ts+Te, 5*Ts+Te . . . . In specific, this is equivalent to adding a sampling delay error −Te to the sampling time of the even-numbered sampled values output by the second ADC.

Therefore, there is a need for a novel method to estimate sampling delay error for calibrating the sampling time of the sub-ADCs in the time-interleaved ADC and compensating the sampling delay error Te.

SUMMARY OF THE INVENTION

One of the objectives of the present invention is to provide a method for estimating sampling delay error of time-interleaved analog-to-digital converter and a related apparatus to solve the above issues.

According to a first aspect of the present invention, an exemplary method for estimating a sampling delay error between a first analog-to-digital converter (ADC) and a second ADC in a time-interleaved ADC is disclosed. The method comprises: receiving a first digital output signal and a second digital output signal generated by the first ADC and the second ADC based on a same analog input signal, respectively; determining a delay amount according to a predetermined sampling delay between the first ADC and the second ADC and an amount of delay adjustment, and applying the delay amount to the second digital output signal to generate a delayed digital output signal, wherein the amount of delay adjustment is used to estimate the sampling delay error Te; calculating a difference between the first digital output signal and the delayed digital output signal; and feeding back the difference to adjust the amount of delay adjustment.

According to a second aspect of the present invention, an exemplary apparatus for estimating a sampling delay error Te between a first analog-to-digital converter (ADC) and a second ADC in a time-interleaved ADC is disclosed. The apparatus comprises a delay filter and a feedback adjustment circuit. The delay filter is coupled to the second ADC, and is arranged for receiving a second digital output signal generated by the second ADC based on an analog input signal, determining a delay amount according to a predetermined sampling delay between the first ADC and the second ADC and amount of delay adjustment, and applying the delay amount to the second digital output signal to generate a delayed digital output signal, wherein the amount of delay adjustment is used to estimate the sampling delay error. The feedback adjustment circuit is coupled to the first ADC and the delay filter, and is arranged for receiving a first digital output signal generated by the first ADC based on an analog input signal, calculating a difference between the first digital output signal and the delayed digital output signal; and feeding back the difference to the delay filter to adjust the amount of delay adjustment.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The main concept of the present invention is to employ an amount of delay adjustment, and use an error detection feedback mechanism to continuously adjust the amount of delay adjustment, to thereby estimate the sampling delay error based on the amount of delay adjustment. Please refer to FIG. 1, which is a diagram illustrating an analog-to-digital conversion system employing a time-interleaved delay error estimation apparatus according to an embodiment of the present invention. The analog-to digital-conversion system 10 includes a first analog-to-digital converter (ADC) 110, a second ADC 112 and a sampling delay error estimation apparatus 100. The first ADC 110 and the second ADC 112 are any two sub-ADCs of the same time-interleaved ADC 111. Supposing the time-interleaved ADC 111 is a two-path time-interleaved ADC, the first ADC 110 and the second ADC 112 are all sub-ADCs within the time-interleaved ADC 111. This is for illustrative purposes only, and not a limitation of the present invention. In practice, the time-interleaved ADC 111 is not restricted to the two-path time-interleaved ADC architecture, and any other design utilizing the disclosed sampling delay error estimation mechanism to estimate the sampling delay error of two sub-ADCs of the time-interleaved ADC 111 falls within the scope of the present invention. Please note that FIG. 1 only depicts components related to the present invention for brevity. However, the analog-to-digital conversion system 10 may further include other components for carrying out functions associated with the analog-to-digital conversion or other operations.

Figure 1:
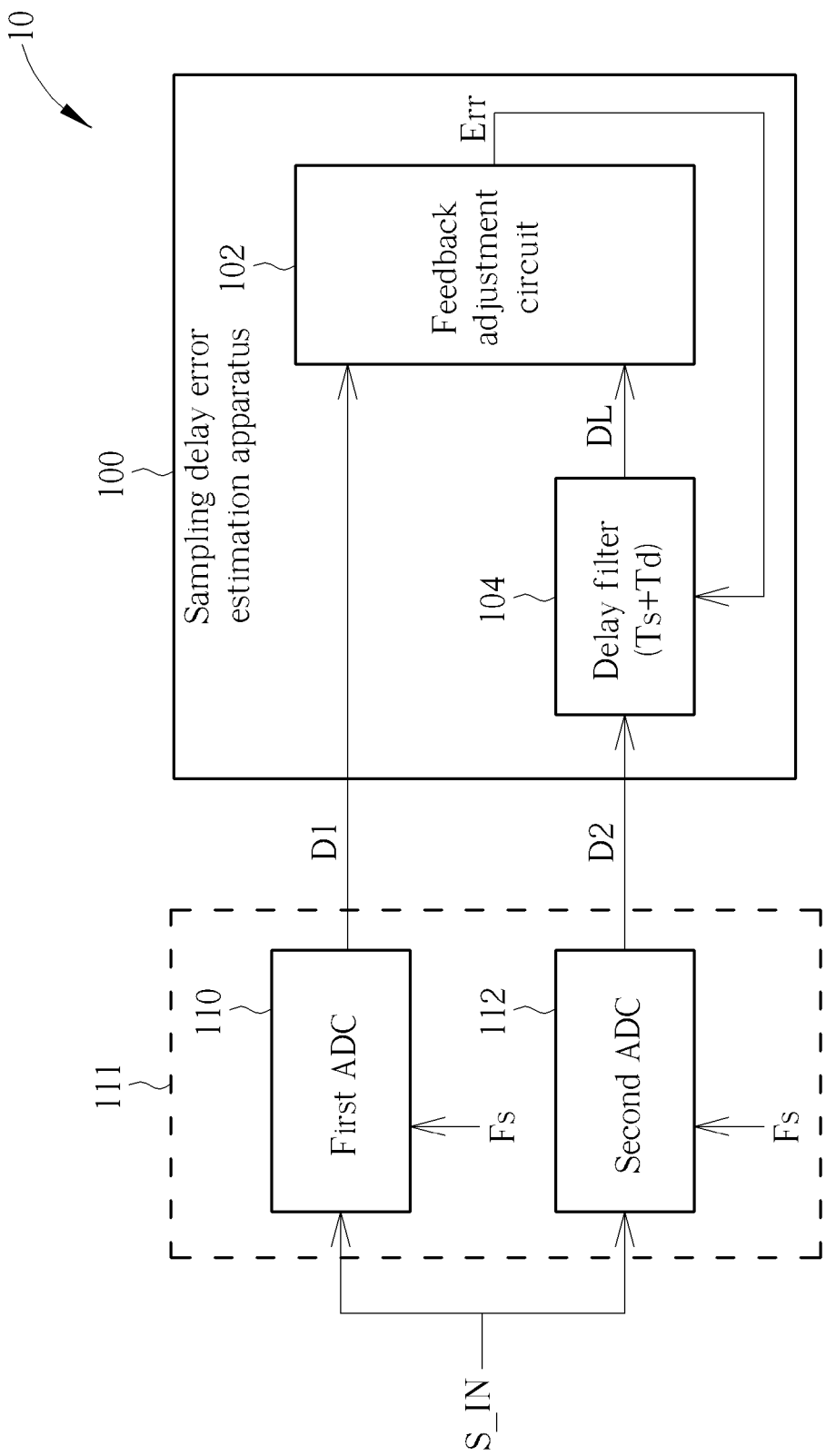
FIG. 1 is a diagram illustrating an analog-to digital-conversion system employing a time-interleaved delay error estimation apparatus according to an embodiment of the present invention.

As can be seen in FIG. 1, the sampling delay error estimation apparatus 100 includes a feedback adjustment circuit 102 and a delay filter 104, wherein the feedback adjustment circuit 102 is coupled to the first ADC 110 and the delay filter 104, and the delay filter 104 is coupled to the second ADC 112.

The first ADC 110 and the second ADC 112 receive an analog signal S_IN at the same time, and sample the analog signal S_IN by using the same sampling frequency Fs (but at different sampling timing). The ideal sampling delay between the first ADC 110 and the second ADC 112 is Ts, wherein Ts is the ideal sampling interval (i.e. the sampling period) and 1/Fs equals Ts. The first ADC 110 and the second ADC 112 output the first digital output signal D1 and the second digital output signal D2, respectively, wherein the first digital output signal D1 is transmitted to the feedback adjustment circuit 102, and the second digital output signal D2 is transmitted to the delay filter 114 to derive a delayed digital output signal DL for the feedback adjustment circuit 102. In this embodiment, the delay filter 104 determines a delay amount (Ts+Td) according to an amount of delay adjustment Td and the predetermined Time-Interleaved ADC sampling period Ts, and applies the delay amount (Ts+Td) to the second digital output signal D2 to produce the delayed digital output signal DL. In addition, the feedback adjustment circuit 102 calculates a difference Err between the first digital output signal D1 and the delayed digital output signal DL, and adjusts the amount of delay adjustment Td based on feedback of the difference Err.

The amount of delay adjustment Td is used for estimating the sampling delay error Te. In addition, the difference Err is used for indicating the degree of difference between the first digital output signal D1 and the delayed digital output signal DL. Supposing there is no sampling delay error between the first ADC 110 and the second ADC 112 (i.e. the sampling delay therebetween equals the predetermined sampling delay Ts), the extra amount of delay adjustment Td will be reflected in the difference Err. Hence, the process of adjusting the amount of delay adjustment Td will continue so that the amount of delay adjustment Td minus Sampling Delay Error Te (e.g. Td−Te) will substantially converge to a value close to zero. The result indicates that the sampling delay error between the first ADC 110 and the second ADC 112 is minimized.

Supposing there is a sampling delay error Te between the first ADC 110 and the second ADC 112 (i.e. the sampling delay therebetween does not equal the predetermined sampling delay Ts), the difference Err will indicate whether the extra amount of delay adjustment Td equals the sampling delay error Te. Hence, the process of adjusting the amount of delay adjustment Td will continue so that the amount of delay adjustment Td will converge to another value which represents the sampling delay error Te between the first ADC 110 and the second ADC 112.

Figure 2:
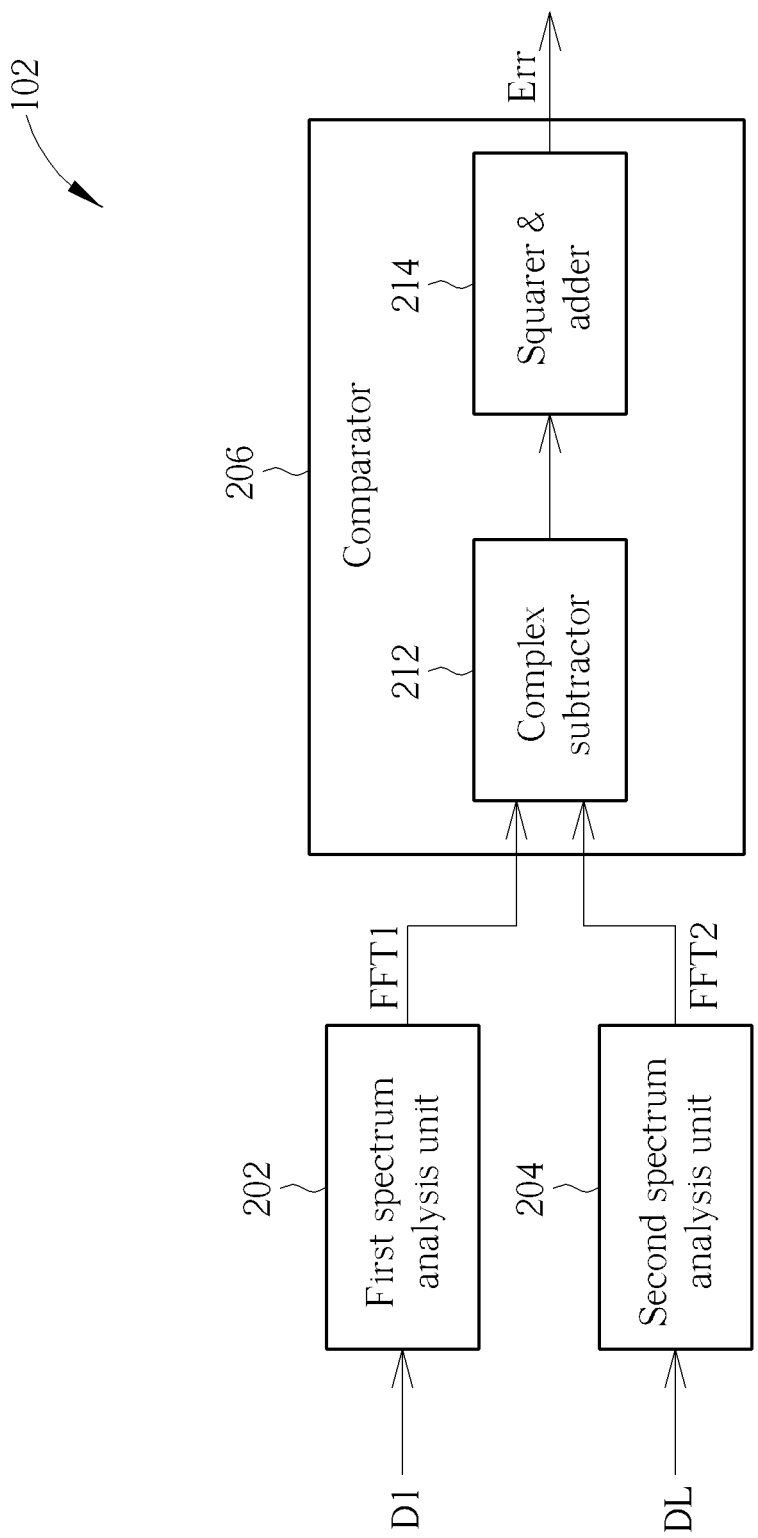
FIG. 2 is a diagram illustrating a feedback adjustment circuit of FIG. 1 according to an embodiment of the present invention.

Please refer to FIG. 2, which is a diagram illustrating a feedback adjustment circuit in FIG. 1 according to an embodiment of the present invention. In this embodiment, the feedback adjustment circuit 102 includes, but not limited to, a first spectrum analysis unit 202, a second spectrum analysis unit 204 and a comparator 206, wherein the comparator 206 is coupled to the first spectrum analysis unit 202, the second spectrum analysis unit 204 and the delay filter 104, and includes a complex subtractor 212 and an absolute square operator 214.

As can be seen in FIG. 2, the first digital output signal D1 and the delayed digital output signal DL is transmitted to the first spectrum analysis unit 204 and the second spectrum analysis unit 206 respectively. For example, the first spectrum analysis unit 204 and the second spectrum analysis unit 206 may perform Fast Fourier Transform (FFT), wherein the transform frequency of the FFT is determined according to a sampling frequency Fs of the first ADC 110 and the second ADC 112. The first spectrum analysis unit 204 outputs the first transform result FFT1, and the second spectrum analysis unit 206 outputs the second transform result FFT2. The first transform result FFT1 and the second transform result FFT2 are transmitted to the comparator 108 at the same time such that the difference Err is calculated via the comparator 206. In this embodiment, the complex subtractor 201 of the comparator 108 performs subtraction upon the first transform result FFT1 and the second transform result FFT2 to obtain a subtraction result (i.e. a complex subtraction output) dc, and passes the subtraction result dc to the square sum operator 202 to calculate a sum of squares of the real part and the imaginary part of the subtraction result dc, which acts as the difference Err. For instance, if the real part and the imaginary part of the subtraction result dc are Re and Im respectively, then the difference Err=$Re^2+Im^2$.

Next, the difference Err generated from the square sum operator 202 is transmitted to the delay filter 114, and the delay filter 114 refers to the difference Err to determine whether to adjust the amount of delay adjustment Td which is currently applied. In one embodiment, the delay filter 104 compares the currently generated difference (Err=err_present) with the previously generated difference (Err=err_last) obtained from the feedback adjustment circuit 102 to generate a comparison result, and selectively increases or decreases the amount of delay adjustment Td according to the comparison result. For example, if the delay filter 104 determines that the amount of delay adjustment Td still needs adjustment (e.g. the difference Err does not become lower than a predetermined target value yet), then the delay filter 104 can update the amount of delay adjustment Td according to the following pseudo code.

```
Td=Td+sign*step_size*Err
sign=1;
if (error_present > error_last)
sign=-sign
else
sign=sign
end
``` where, step_size is the size of the adjustment step, and sign indicates a positive or negative sign. It should be noted that the difference Error and the step size step_size are both positive numbers. The adjustment (increase or decrease) made to the amount of delay adjustment Td is determined by referring to the sign. When the currently generated difference is greater than the previously generated difference, the delay filter 104 will decrease the amount of delay adjustment Td according to the comparison result (e.g. Td=Td−step_size*error_present). When the currently generated difference is not greater than the previously generated difference, the delay filter 104 will increase the amount of delay adjustment Td according to the comparison result (e.g. Td=Td+step_size*error_present).

In light of the above, the delay filter 104 continually adjusts the amount of delay adjustment Td by feeding back the difference Err, until the difference Err equals a predetermined target value (e.g. a value close to or equal to zero). For instance, the sampling delay error estimation apparatus 100 reduces the difference Err through the feedback adjustment applied to the amount of delay adjustment Td until the difference Err reaches a value which is small enough. The value of the amount of delay adjustment Td represents the sampling delay error between the first ADC 110 and the second ADC 112.

It should be noted that utilizing the complex subtractor 212 and the absolute square operator 214 to implement the comparator 206 is for illustrative purposes only, but not a limitation of the present invention. Any other design that compares the first transform result FFT1 with the second transform result FFT2 to obtain the difference Err for indicating the degree of difference between the first digital output signal D1 and the delayed digital output signal DL also falls within the scope of the present invention. Similarly, the feedback adjustment circuit shown in FIG. 2 is for illustrative purposes only. Any other design that estimates the sampling delay error by continually feeding back the amount of delay adjustment Td based on the degree of difference between the first digital output signal D1 and the delayed digital output signal DL also complies with the concept of the present invention.

Figure 3:
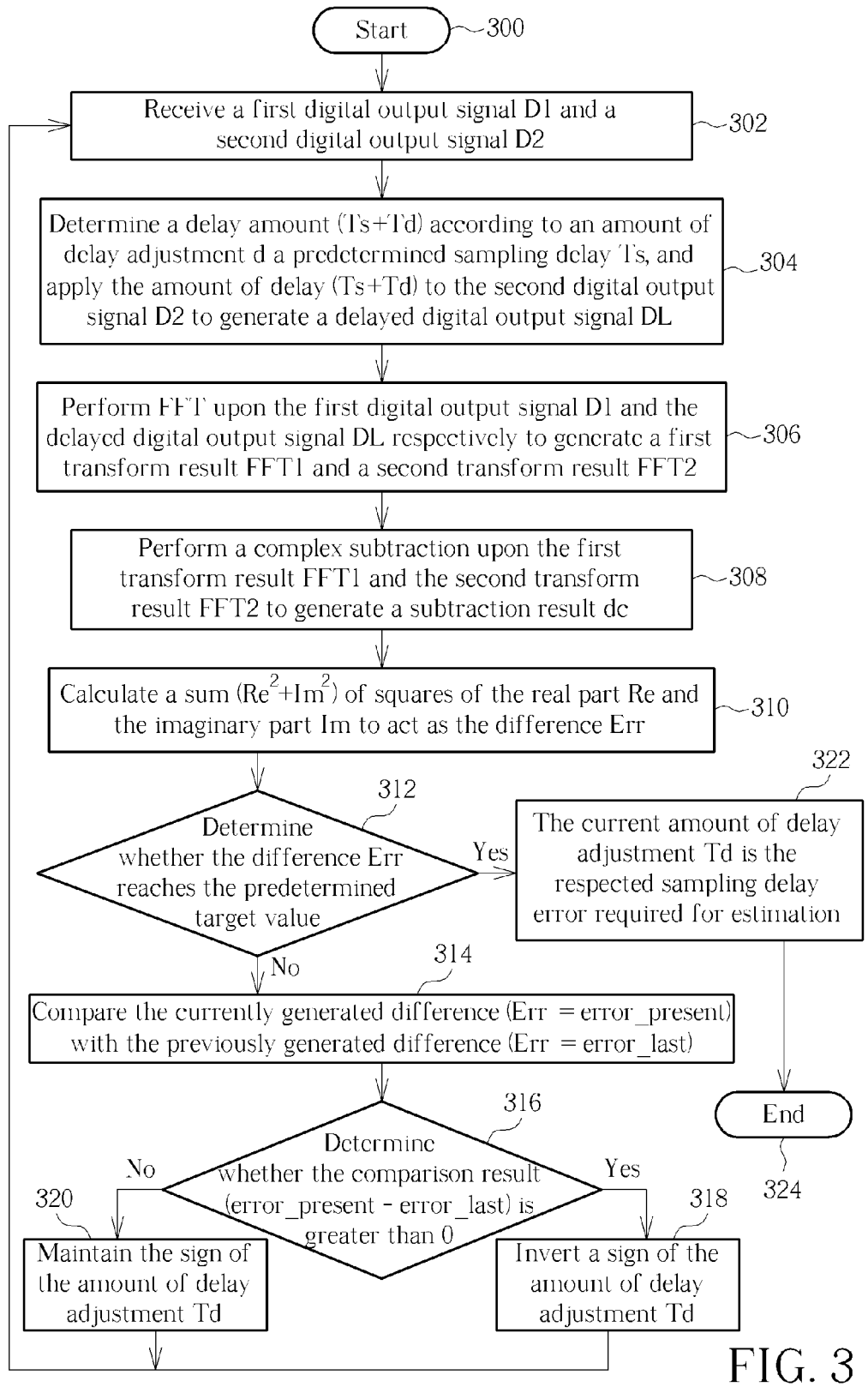
FIG. 3 is a flowchart illustrating a method for estimating a sampling delay error between a first ADC and a second ADC in a time-interleaved ADC according to an embodiment of the present invention.

Please refer to FIG. 3, which is a flowchart illustrating a method for estimating a sampling delay error between a first ADC and a second ADC in a time-interleaved ADC according to an embodiment of the present invention. Provided that substantially the same result is achieved, the steps of the flowchart shown in FIG. 3 need not be in the exact order shown and need not be contiguous; that is, other steps can be intermediate. Some steps in FIG. 3 may be omitted according to various embodiments or requirements. The method may be briefly summarized as follows.

Step 300: Start.

Step 302: Receive a first digital output signal D1 and a second digital output signal D2.

Step 304: Determine a delay amount (Ts+Td) according to an amount of delay adjustment Td and a predetermined sampling delay Td, and apply the amount of delay (Ts+Td) to the second digital output signal D2 to generate a delayed digital output signal DL.

Step 306: Perform FFT upon the first digital output signal D1 and the delayed digital output signal DL respectively to generate a first transform result FFT1 and a second transform result FFT2.

Step 308: Perform a complex subtraction upon the first transform result FFT1 and the second transform result FFT2 to generate a subtraction result dc.

Step 310: Calculate a sum of squares of the real part Re and the imaginary part Im (i.e., $Re^2+Im^2$) to act as the difference Err.

Step 312: Determine whether the difference Err reaches the predetermined target value. If yes, go to Step 322, else go to Step 314.

Step 314: Compare the currently generated difference (Err=error_present) with the previously generated difference (Err=error_last).

Step 316: Determine whether the comparison result (error_present−error_last) is greater than 0. If yes, go to Step 318, else go to Step 320.

Step 318: Invert a sign of the amount of delay adjustment Td, and go to step 302.

Step 320: Maintain the sign of the amount of delay adjustment Td, and go to step 302.

Step 322: The current amount of delay adjustment Td is the sampling delay error estimated.

Step 324: End.

As a person skilled in the art can readily understand details of each step shown in FIG. 3 after reading the above paragraphs directed to the circuits shown in FIG. 1 and FIG. 2, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for estimating a sampling delay error between a first analog-to-digital converter (ADC) and a second ADC in a time-interleaved ADC, comprising:

receiving a first digital output signal and a second digital output signal generated by the first ADC and the second ADC based on a same analog input signal, respectively;

determining a delay amount according to a predetermined sampling delay between the first ADC and the second ADC and an amount of delay adjustment of a delay filter, and using the delay filter to apply the delay amount to the second digital output signal to generate a delayed digital output signal, wherein the amount of delay adjustment is used to estimate the sampling delay error;

calculating a difference between the first digital output signal and the delayed digital output signal; and feeding back the difference to adjust the amount of delay adjustment of the delay filter.

2. The method of claim 1, wherein the step of calculating the difference between the first digital output signal and the delayed digital output signal comprises:

performing a spectrum analysis upon the first digital output signal and the delayed digital output signal to generate a first transform result and a second transform result, respectively; and comparing the first transform result with the second transform result to obtain the difference.

3. The method of claim 2, wherein the spectrum analysis is a fast Fourier transform (FFT).

4. The method of claim 2, wherein the step of comparing the first transform result with the second transform result to obtain the difference comprises:
   performing a complex subtraction upon the first transform result and the second transform result to generate a subtraction result; and
   calculating a sum of squares of a real part and an imaginary part of the subtraction result to act as the difference.

5. The method of claim 3, wherein the step of calculating the difference between the first digital output signal and the delayed digital output signal comprises:
   determining a transform frequency of the FFT according to the first ADC and the second ADC.

6. The method of claim 1, wherein the step of feeding back the difference to adjust the amount of delay adjustment comprises:
   continually adjusting the amount of delay adjustment by feeding back the difference, until the difference equals a predetermined target value.

7. The method of claim 6, wherein the step of feeding back the difference to adjust the amount of delay adjustment comprises:
   comparing the difference that is currently generated with the difference that is previously generated to generate a comparison result, and selectively increasing or decreasing the amount of delay adjustment according to a comparison result.

8. An apparatus for estimating a sampling delay error between a first analog-to-digital converter (ADC) and a second ADC in a time-interleaved ADC, comprising:
   a delay filter, coupled to the second ADC, the delay filter arranged for receiving a second digital output signal generated by the second ADC based on an analog input signal, determining a delay amount according to a predetermined sampling delay between the first ADC and the second ADC and an amount of delay adjustment, and applying the delay amount to the second digital output signal to generate a delayed digital output signal, wherein the amount of delay adjustment is used to estimate the sampling delay error; and
   a feedback adjustment circuit, coupled to the first ADC and the delay filter, the feedback adjustment circuit arranged for receiving a first digital output signal generated by the first ADC based on the analog input signal, calculating a difference between the first digital output signal and the delayed digital output signal; and feeding back the difference to the delay filter to adjust the amount of delay adjustment.

9. The sampling delay error estimation apparatus of claim 7, wherein the feedback adjustment circuit comprises:
   a first spectrum analysis unit, arranged for performing a spectrum analysis upon the first digital output signal and the delayed digital output signal to generate a first transform result and a second transform result, respectively; and
   a comparator, arranged for comparing the first transform result with the second transform result to obtain the difference.

10. The apparatus of claim 9, wherein the spectrum analysis is a fast Fourier transform (FFT).

11. The sampling delay error estimation apparatus of claim 9, wherein the feedback adjustment circuit further comprises:
   a complex subtractor, arranged for performing a complex subtraction upon the first transform result and the second transform result to generate a subtraction result; and
   a square sum operator, arranged for calculating a sum of squares of a real part and an imaginary part of the subtraction result to act as the difference.

12. The sampling delay error estimation apparatus of claim 10, wherein a transform frequency of the FFT is determined according to a sampling frequency of the first ADC and the second ADC.

13. The sampling delay error estimation apparatus of claim 8, wherein the delay filter continually adjusts the amount of delay adjustment by feeding back the difference, until the difference equals a predetermined target value.

14. The sampling delay error estimation apparatus of claim 13, wherein the delay filter compares the difference that is currently generated with the difference that is previously generated to generate a comparison result, and selectively increases or decreases the amount of delay adjustment according to the comparison result.

* * * * *